United States Patent [19]

Yoshida

[11] Patent Number: 5,444,326
[45] Date of Patent: Aug. 22, 1995

[54] PIEZOELECTRIC-RESONANCE DEVICE

[75] Inventor: Ryuhei Yoshida, Nagaokakyo, Japan

[73] Assignee: Murata Manufacturing Co., Ltd., Kyoto, Japan

[21] Appl. No.: 201,923

[22] Filed: Feb. 24, 1994

[30] Foreign Application Priority Data

Feb. 25, 1993 [JP] Japan .................. 5-037034

[51] Int. Cl.$^6$ ............................. H01L 41/08
[52] U.S. Cl. ................................ 310/359; 310/320
[58] Field of Search ............. 310/359, 365, 329, 357

[56] References Cited

U.S. PATENT DOCUMENTS

| | | | |
|---|---|---|---|
| 3,374,367 | 3/1968 | Cowan | 310/359 |
| 3,961,210 | 6/1976 | Nagata et al. | 310/320 |
| 4,109,359 | 8/1978 | Cross et al. | 310/359 |
| 4,336,510 | 6/1982 | Miyamori | 310/366 |
| 4,564,782 | 1/1986 | Ogawa | 310/359 |
| 4,605,876 | 8/1986 | Ogawa et al. | 310/358 |
| 4,628,285 | 12/1986 | Nakatani et al. | 310/357 |
| 4,633,204 | 12/1986 | Gounji et al. | 310/359 |
| 4,714,848 | 12/1987 | Chen | 310/359 |
| 4,918,350 | 4/1990 | Ando et al. | 310/320 |
| 4,939,403 | 7/1990 | Kittaka et al. | 310/359 |
| 5,057,801 | 10/1991 | Kittaka et al. | 310/366 |
| 5,168,253 | 12/1992 | Nakagawa et al. | 310/357 |

Primary Examiner—Thomas M. Dougherty
Attorney, Agent, or Firm—Ostrolenk, Faber, Gerb & Soffen

[57] ABSTRACT

A piezoelectric-resonance device comprising a piezoelectric ceramic body, a pair of excitation electrodes provided so as to be opposed to each other with the piezoelectric ceramic body interposed therebetween, and connecting conductive portions connecting the excitation electrodes and side edges of the piezoelectric ceramic material, a portion, which is interposed between the excitation electrodes, of the piezoelectric ceramic body being polarized in the opposite direction to the direction of polarization of the other portion thereof.

10 Claims, 4 Drawing Sheets

PIEZOELECTRIC-RESONANCE DEVICE

BACKGROUND OF THE INVENTION

1. Field of the Invention

The present invention relates to an energy-trapped type piezoelectric-resonance device utilizing a thickness-extensional vibration mode.

2. Description of the Related Art

An energy-trapped type piezoelectric resonator of a thickness-extensional vibration mode using a piezoelectric ceramic material has been conventionally known. FIGS. 5 and 6 show a conventional piezoelectric resonator, where FIG. 5 is a plan view, and FIG. 6 is a cross sectional view taken along a line A—A shown in FIG. 5. Referring to FIGS. 5 and 6, excitation electrodes 2 and 3 are provided in center parts of major surfaces on both sides of a piezoelectric ceramic body 1. Connecting conductive portions 4 and 5 extending toward side edges of the piezoelectric ceramic body 1 are respectively connected to the excitation electrodes 2 and 3. The piezoelectric ceramic body 1 is polarized in one of the directions of thickness as a whole, as shown in FIG. 6.

As such a piezoelectric resonator, a piezoelectric resonator which can be used in a high frequency band of, for example, 10 to 15 MHz has been desired. Piezoelectric ceramics of a PZT (lead zirconate titanate) series has been used as a piezoelectric ceramic material of such a piezoelectric resonator of a thickness-extensional vibration mode. The fundamental wave of the piezoelectric ceramics of a PZT series is in the range of 6 to 13 MHz. In order to vibrate the piezoelectric ceramics of a PZT series in a higher frequency band, the thickness of a piezoelectric ceramic body of the piezoelectric resonator must be decreased. However, such piezoelectric ceramics of a PZT series is inferior in heat resistance, temperature characteristics and shock resistance. If a piezoelectric resonator in a high frequency band is mass-produced, therefore, the fraction defective thereof is increased.

Furthermore, it is considered that a piezoelectric resonator in a high frequency band utilizing a third harmonic wave of a thickness-extensional vibration mode is manufactured. As a piezoelectric ceramic material of such a piezoelectric resonator utilizing a third harmonic wave, a material of a lead titanate series is considered. The frequency band of the third harmonic wave of such a piezoelectric ceramic material of a lead titanate series is in the range of 12 to 40 MHz. In order to change the frequency band of the third harmonic wave into a frequency band of 10 to 15 MHz, therefore, the thickness of a piezoelectric ceramic body of the piezoelectric resonator must be increased. Consequently, the damping effect of the piezoelectric resonator is increased and the shape thereof becomes large.

However, a piezoelectric material of a lead titanate series is low in dielectric constant, has relatively large piezoelectric characteristics, and has a high mechanical quality factor Qm. In addition, a piezoelectric material of a lead titanate series has some superior features. For example, it has a high Curie temperature. Further, it is not easily degraded even at high temperatures. Consequently, it is preferable to use such a piezoelectric material of a lead titanate series. In order to utilize a frequency band of 10 to 15 MHz without increasing the thickness of the piezoelectric ceramic body, it is preferable to trap the energy of the fundamental wave of a thickness-extensional vibration mode of the piezoelectric material of a lead titanate series.

Since the Poisson's ratio of the piezoelectric material of a lead titanate series is not more than $\frac{1}{3}$, however, it is known that the fundamental wave cannot be trapped even in a general structure. In order to trap the fundamental wave in a piezoelectric material having a Poisson's ratio of not more than $\frac{1}{3}$, as shown in FIG. 7, the piezoelectric resonator must have a structure in which the thickness in the center of a piezoelectric ceramic body 1 is decreased and the thickness of a portion interposed between excitation electrodes 2 and 3 is decreased. Alternatively, as shown in FIG. 8, it must have a structure in which another electrode 6 which is not electrically connected to an excitation electrode 2 is provided around the excitation electrode 2 to short-circuit the electrodes on both sides of the ceramic body 1.

Such structures are complicated, so that it is difficult to process to make the structures.

SUMMARY OF THE INVENTION

An object of the present invention is to provide an energy-trapped type piezoelectric-resonance device of a thickness-extensional vibration mode capable of trapping the fundamental wave of a piezoelectric material having a Poisson's ratio of not more than $\frac{1}{3}$ such as a piezoelectric ceramic material of a lead titanate series in a simple structure.

A piezoelectric-resonance device according to the present invention comprises a piezoelectric ceramic body, a pair of excitation electrodes provided so as to be opposed to each other with the piezoelectric ceramic body interposed therebetween, and connecting conductive portions connecting the excitation electrodes and side edges of the piezoelectric ceramic body, which is characterized in that a portion, which is interposed between the excitation electrodes, of the piezoelectric ceramic body is polarized in the opposite direction to the direction of polarization of the other portion thereof.

As a result of examining the structure of a resonator in which the fundamental wave can be trapped using a material having a Poisson's ratio of not more than $\frac{1}{3}$ such as a piezoelectric ceramic material of a lead titanate series, the inventor of the present invention have found that the fundamental wave can be trapped by polarizing the portion, which is interposed between the excitation electrodes, of the piezoelectric ceramic body and the other portion thereof in the opposite directions.

Specifically, in the present invention, the portion, which is interposed between the excitation electrodes, of the piezoelectric ceramic body and the other portion thereof are polarized in the opposite directions. Accordingly, induced charges in a portion below the excitation electrodes are opposite to those in the peripheral portion so that there occurs a 180° phase difference therebetween, thereby to excite the fundamental standing wave.

According to the present invention, the portion, which is interposed between the excitation electrodes, of the piezoelectric ceramic body is polarized in the opposite direction to the direction of polarization of the other portion thereof, thereby to make it possible to trap the energy of the fundamental wave of a piezoelectric material even if the piezoelectric material has an effective Poisson's ratio of not more than $\frac{1}{3}$. Consequently, it is possible to use a piezoelectric ceramic material of a lead titanate series. The piezoelectric ceramic material of a lead titanate series is harder than the piezoelectric ceramic material of a PZT series. Accordingly, it is possible to decrease the thickness of the piezoelectric ceramic material of a lead titanate series, thereby to make it possible to design a piezoelectric-resonance device which can be easily handled. In addition, the coupling coefficient of the piezoelectric ceramic material of a lead titanate series is smaller than that of the piezoelectric ceramic material of a PZT series, thereby to make it possible to design a piezoelectric-resonance device for a narrow bandwidth. Further, the temperature characteristics of the piezoelectric ceramic material of a lead titanate series are superior and the spurious (the higher mode) thereof is small, thereby to make it possible to design a piezoelectric-resonance device in which there is no abnormal oscillation such as frequency jumping.

Furthermore, it is possible to decrease the capacitance between terminals thereof because of its low dielectric constant, thereby to make it possible to design a piezoelectric-resonance device to consume smaller power.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
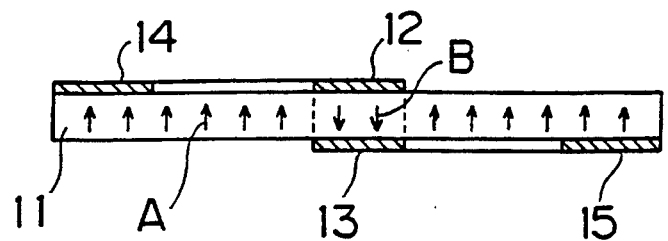
FIG. 1 is a cross sectional view showing one embodiment of the present invention taken along the line B—B of FIG. 2.
Figure 2:
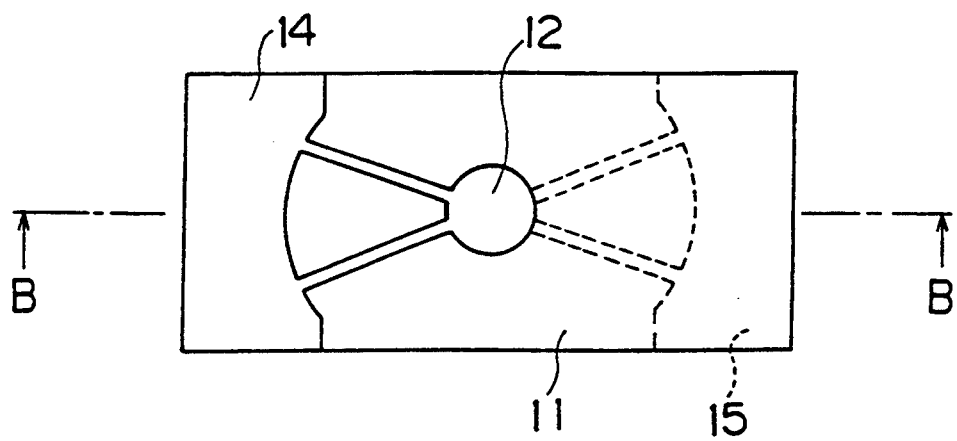
FIG. 2 is a plan view showing embodiment of FIG. 1.

FIGS. 1 and 2 illustrate one embodiment of the present invention, where FIG. 2 is a plan view, and FIG. 1 is a cross sectional view taken along a line B—B shown in FIG. 2.

Referring to FIGS. 1 and 2, excitation electrodes 12 and 13 are respectively provided in center parts of major surfaces on both sides of a piezoelectric ceramic body 11 composed of a ceramic material of a lead titanate series so as to be opposed to each other with the piezoelectric ceramic body 11 interposed therebetween. Connecting conductive portions 14 and 15 connected to side edges of the piezoelectric ceramic body 11 are respectively connected to the excitation electrodes 12 and 13. The connecting conductive portions 14 and 15 are so provided as to extend in different directions and as not to be overlapped with each other on both sides of the piezoelectric ceramic body 1.

As shown in FIG. 1, a portion, which is interposed between the excitation electrodes 12 and 13, of the piezoelectric ceramic body 11 and the other portion thereof are respectively polarized in a direction indicated by an arrow B and in the opposite direction indicated by an arrow A. Consequently, the portion, which is interposed between the excitation electrodes 12 and 13, of the piezoelectric ceramic body 11 is polarized in the opposite direction to the direction of polarization of the other portion thereof.

Figure 3:
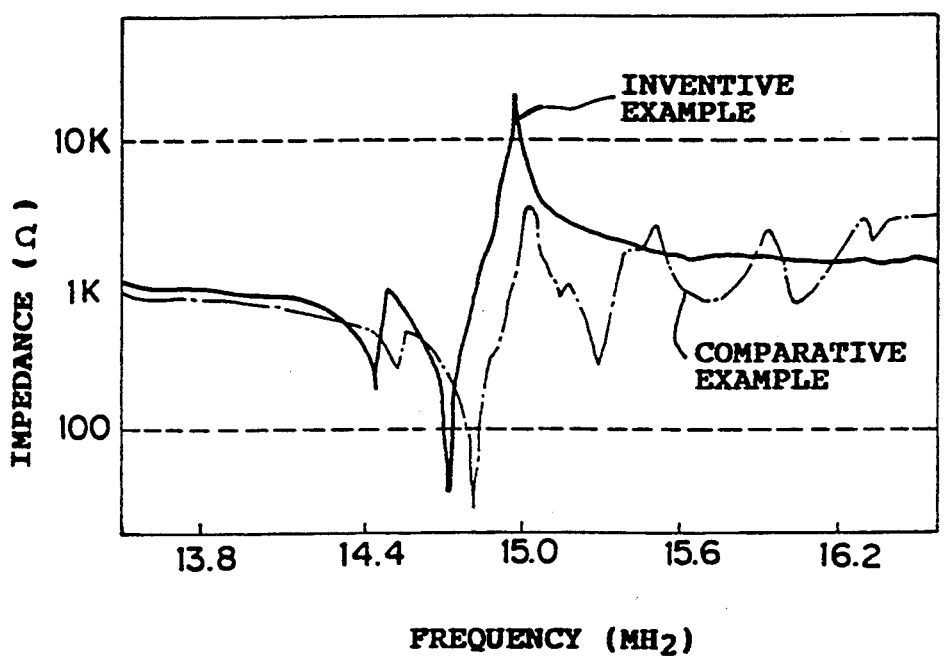
FIG. 3 is a diagram showing impedance-frequency characteristics in the vicinity of a fundamental wave of a piezoelectric resonator according to the embodiment shown in FIGS. 1 and 2.
Figure 5:
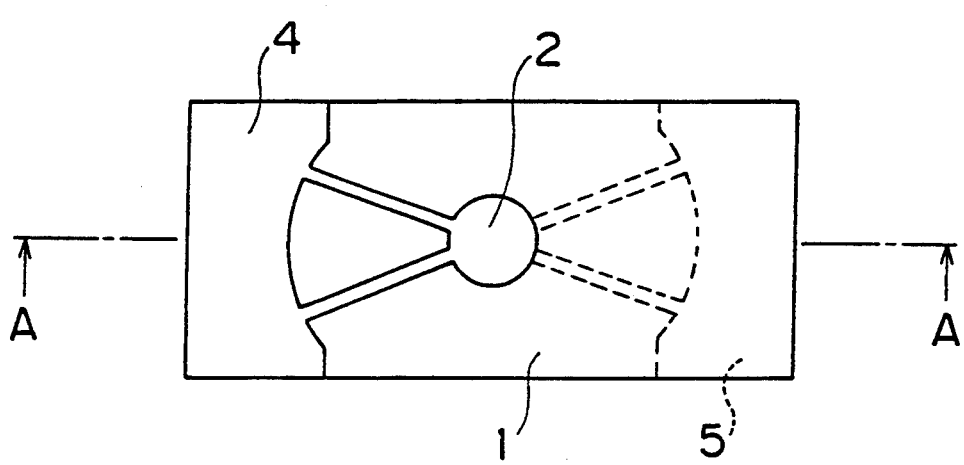
FIG. 5 is a plan view showing a conventional piezoelectric-resonance device.
Figure 6:
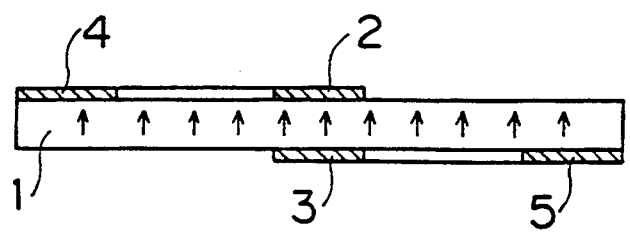
FIG. 6 is a cross sectional view showing the conventional piezoelectric-resonance device.
Figure 7:
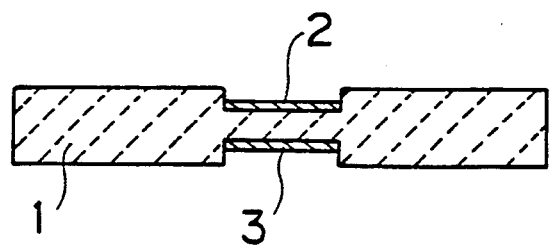
FIG. 7 is a cross sectional view showing one example of the structure of a comparative piezoelectric-resonance device for trapping the fundamental wave using a material having an effective Poisson's ratio of not more than $\frac{1}{3}$.
Figure 8:
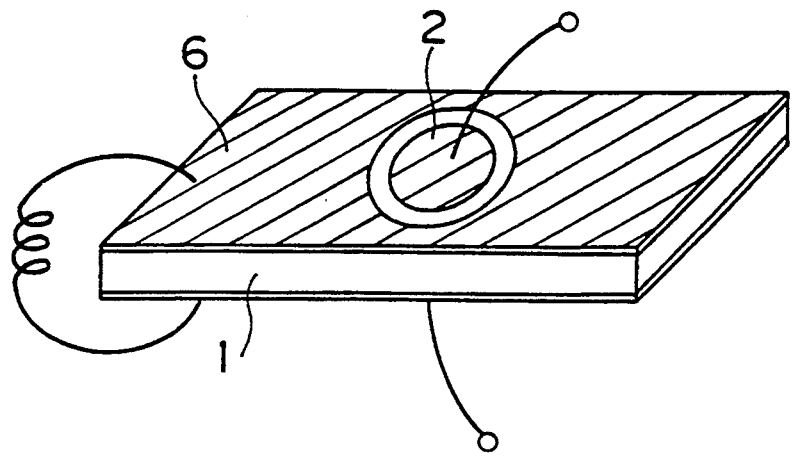
FIG. 8 is a perspective view showing another example of the structure of a comparative piezoelectric-resonance device for trapping the fundamental wave using a material having an effective Poisson's ratio of not more than $\frac{1}{3}$.

FIG. 3 is a diagram showing impedance-frequency characteristics in the vicinity of the fundamental wave of the piezoelectric resonator according to the embodiment shown in FIGS. 1 and 2. For comparison, impedance-frequency characteristics of a piezoelectric resonator in which the entire piezoelectric ceramic body is polarized in the same direction as shown in FIGS. 5 and 6 are indicated by a one-dot and dash line. As can be seen from FIG. 3, in the piezoelectric resonator according to the embodiment of the present invention, the energy of the fundamental wave of a thickness-extensional vibration mode is trapped.

Figure 4:
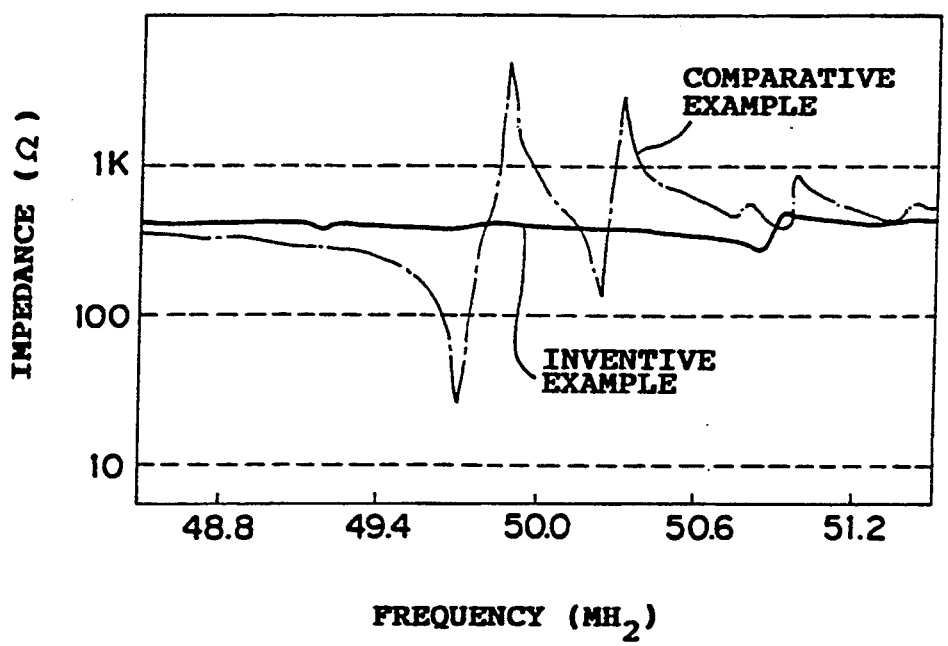
FIG. 4 is a diagram showing impedance-frequency characteristics in the vicinity of a third harmonic wave in the embodiment shown in FIGS. 1 and 2.

FIG. 4 is a diagram showing impedance-frequency characteristics of a third harmonic wave according to the embodiment shown in FIGS. 1 and 2. Also in FIG. 4, impedance-frequency characteristics of the comparative piezoelectric resonator are indicated by a one-dot and dash line. As apparent from FIG. 4, the energy of the third harmonic wave of a thickness-extensional vibration mode is trapped in the comparative piezoelectric resonator, while not being trapped in the piezoelectric resonator according to the present invention.

As described in the foregoing, according to the present invention, it is possible to trap the energy of the fundamental wave by polarizing the portion, which is interposed between the excitation electrodes, of the piezoelectric ceramic body in the opposite direction to the direction of polarization of the other portion thereof.

Figure 9:
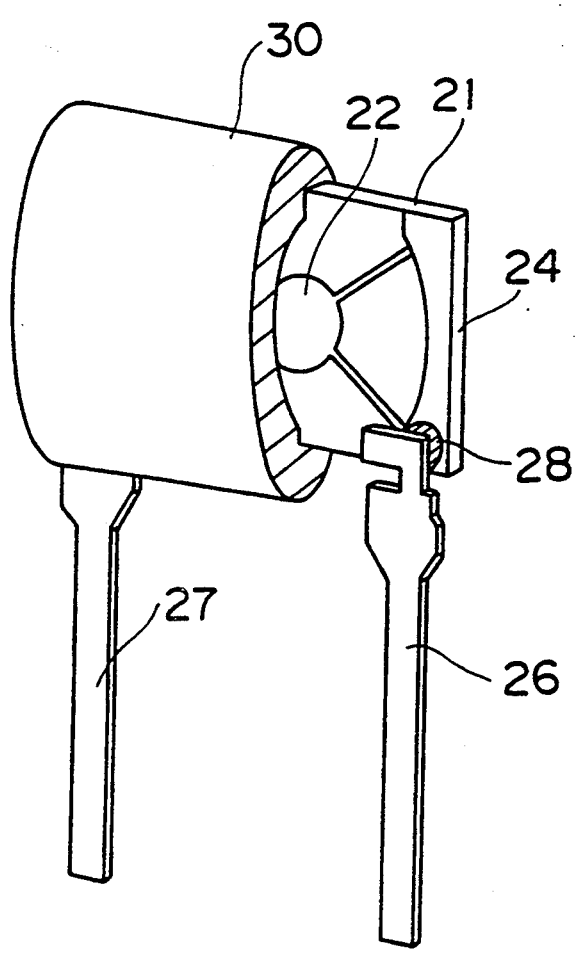
FIG. 9 is a partial cutaway perspective view showing a piezoelectric resonator according to the embodiment of the present invention which is sheathed by resin dipping.

FIG. 9 is a partial cutaway perspective view showing a piezoelectric resonator according to the embodiment of the present invention which is sheathed by resin dipping. Referring to FIG. 9, excitation electrodes and connecting conductive portions are formed on a piezoelectric ceramic body 21 according to the present embodiment, as in the embodiment shown in FIGS. 1 and 2. In FIG. 9, an excitation electrode 22 and a connecting conductive portion 24 are illustrated. A terminal 26 is mounted on the connecting conductive portion 24 through a solder portion 28. A terminal 27 is similarly mounted on a connecting conductive portion on the major surface on the opposite side of the piezoelectric ceramic body 21 through a solder portion. Both the excitation electrode and the connecting conductive portion are formed by evaporating Ag. Further, the solder portion is composed of an Sn-Pb-Ag alloy. A sheathing resin portion 30 is formed by resin dipping in a state where the terminals 26 and 27 are mounted. In the present embodiment, the sheathing resin portion 30 is composed of epoxy resin. Although in the above described embodiment, a piezoelectric material having a Poisson's ratio of not more than $\frac{1}{3}$ such as lead titanate is used as a piezoelectric ceramic material, the present invention is not limited to the same. Therefore, the present invention is also applicable to a piezoelectric material having a Poisson's ratio of not less than $\frac{1}{3}$ such as PZT.

Although a method of polarizing the portion, which is interposed between the excitation electrodes, of the piezoelectric ceramic body in the opposite direction is not particularly limited, the following methods, for example, can be used to perform polarization processing.

One example is a method of forming electrodes on the entire major surfaces on both sides of a piezoelectric ceramic body to perform polarization processing in the direction of thickness, for example, a direction A as shown in FIG. 1 and then, removing portions other than excitation electrodes 12 and 13 and connecting conductive portions 14 and 15 as shown in FIGS. 1 and 2 by etching or the like and then, applying a voltage to a portion between the excitation electrodes 12 and 13 to perform polarization processing in a direction B so that the direction of polarization of the portion between the excitation electrodes 12 and 13 is reversed.

Another example is a method of respectively forming electrodes for polarization processing on a portion on excitation electrodes and the other portion so that they are polarized in the opposite directions.

In the present invention, a method of applying a voltage to a piezoelectric ceramic body to perform polarization processing is not limited to the above described methods. In addition thereto, various methods can be used to perform polarization processing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric-resonance device comprising:
   a piezoelectric ceramic body;
   a pair of excitation electrodes provided on opposite surfaces of said piezoelectric ceramic body; and
   conductive portions connecting said excitation electrodes and side edges of said piezoelectric ceramic body,
   the portion of said piezoelectric ceramic body between said opposed excitation electrodes being uniformly polarized in one direction, and the remaining portion of said body being polarized in the opposite direction.

2. The piezoelectric-resonance device according to claim 1, wherein said piezoelectric ceramic body is composed of a piezoelectric material having a Poisson's ratio of not more than $\frac{1}{3}$.

3. The piezoelectric-resonance device according to claim 2, wherein said piezoelectric material having a Poisson's ratio of not more than $\frac{1}{3}$ is one of lead titanate materials.

4. The piezoelectric-resonance device according to claim 1, wherein said piezoelectric ceramic body is composed of a piezoelectric material having a Poisson's ratio of not less than $\frac{1}{3}$.

5. The piezoelectric-resonance device according to claim 4, wherein said piezoelectric material having a Poisson's ratio of not less than $\frac{1}{3}$ is PZT.

6. The piezoelectric-resonance device according to claim 1, wherein the piezoelectric ceramic body traps the energy of the fundamental wave of a thickness-extensional vibration mode of said piezoelectric ceramic body.

7. The piezoelectric-resonance device according to claim 6, wherein said piezoelectric ceramic body is composed of a piezoelectric material having a Poisson's ratio of not more than $\frac{1}{3}$.

8. The piezoelectric-resonance device according to claim 7, wherein said piezoelectric material having a Poisson's ratio of not more than $\frac{1}{3}$ is one of lead titanate materials.

9. The piezoelectric-resonance device according to claim 6, wherein said piezoelectric ceramic body is composed of a piezoelectric material having a Poisson's ratio of not less than $\frac{1}{3}$.

10. The piezoelectric-resonance device according to claim 9, wherein said piezoelectric material having a Poisson's ratio of not less than $\frac{1}{3}$ is PZT.

* * * * *